United States Patent
Shinya et al.

(10) Patent No.: US 10,612,154 B2
(45) Date of Patent: Apr. 7, 2020

(54) METHOD FOR PREPARING SIC SINGLE CRYSTAL

(71) Applicant: SHIN-ETSU CHEMICAL CO., LTD., Tokyo (JP)

(72) Inventors: Naofumi Shinya, Echizen (JP); Yu Hamaguchi, Echizen (JP); Norio Yamagata, Echizen (JP); Takehisa Minowa, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 54 days.

(21) Appl. No.: 15/945,896

(22) Filed: Apr. 5, 2018

(65) Prior Publication Data

US 2018/0298519 A1    Oct. 18, 2018

(30) Foreign Application Priority Data

Apr. 14, 2017    (JP) ................................. 2017-080250

(51) Int. Cl.
| | |
|---|---|
| *C30B 9/00* | (2006.01) |
| *C30B 1/02* | (2006.01) |
| *C30B 9/06* | (2006.01) |
| *C30B 19/04* | (2006.01) |
| *C30B 19/12* | (2006.01) |

(Continued)

(52) U.S. Cl.
CPC .................. *C30B 1/02* (2013.01); *C30B 9/06* (2013.01); *C30B 19/04* (2013.01); *C30B 19/12* (2013.01); *C30B 29/36* (2013.01); *C30B 33/02* (2013.01)

(58) Field of Classification Search
CPC .............. C30B 9/00; C30B 9/10; C30B 29/36
See application file for complete search history.

(56) References Cited

U.S. PATENT DOCUMENTS

| | | |
|---|---|---|
| 5,958,132 A | 9/1999 | Takahashi et al. |
| 7,520,930 B2 | 4/2009 | Kusunoki et al. |
| 7,635,413 B2 | 12/2009 | Kusunoki et al. |

(Continued)

FOREIGN PATENT DOCUMENTS

| | | |
|---|---|---|
| EP | 2733239 A1 | 5/2014 |
| JP | H05-262599 A | 10/1993 |

(Continued)

OTHER PUBLICATIONS

Extended European Search Report dated Jul. 16, 2018, issued in counterpart European Application No. 18165604.2. (8 pages).

(Continued)

*Primary Examiner* — Robert M Kunemund
(74) *Attorney, Agent, or Firm* — Westerman, Hattori, Daniels & Adrian, LLP

(57) ABSTRACT

A SiC single crystal is prepared by the solution process of placing a seed crystal in contact with a Si—C solution in a crucible and letting a SiC single crystal to grow from the seed crystal. The method includes the first growth step of conducting crystal growth using (0001) or (000-1) plane of a SiC single crystal of which the seed crystal is composed, as the growth surface, and the second growth step of conducting crystal growth using (1-100) or (11-20) plane of a SiC single crystal resulting from the first growth step as the growth surface. A SiC single crystal of high homogeneity and quality is obtained, which is reduced in threading screw dislocations, threading edge dislocations, basal plane dislocations, micropipes, and stacking faults.

13 Claims, 4 Drawing Sheets

(51) Int. Cl.
*C30B 29/36* (2006.01)
*C30B 33/02* (2006.01)

(56) References Cited

U.S. PATENT DOCUMENTS

| | | |
|---|---|---|
| 2015/0128847 A1 | 5/2015 | Danno |
| 2015/0159297 A1 | 6/2015 | Shinya et al. |
| 2016/0230309 A1 | 8/2016 | Danno |

FOREIGN PATENT DOCUMENTS

| | | |
|---|---|---|
| JP | 2000-264790 A | 9/2000 |
| JP | 2004-2173 A | 1/2004 |
| JP | 2006-143555 A | 6/2006 |
| JP | 2014-201466 A | 10/2014 |
| JP | 2015-54814 A | 3/2015 |
| JP | 2015-110495 A | 6/2015 |
| JP | 2015-110496 A | 6/2015 |
| JP | 2015-110498 A | 6/2015 |
| JP | 2015-110499 A | 6/2015 |
| JP | 2015-110500 A | 6/2015 |
| JP | 2015-110501 A | 6/2015 |
| JP | 2017-31034 A | 2/2017 |
| JP | 2017-31036 A | 2/2017 |
| WO | 2013/157418 A1 | 10/2013 |
| WO | 2017/022535 A1 | 2/2017 |
| WO | 2017/022536 A1 | 2/2017 |

OTHER PUBLICATIONS

"Newest Technology of SiC Power Device", Chap. 4, Section 1, 1.2 SiC Solution Growth, May 14, 2010, pp. 41-43, S&T Publishing Co., Ltd., w/English Translation, Cited in Specification, (8 pages).

Onda., "Study on fine structure of 4H-SiC crystal defects and influence on device properties", Doctoral Thesis of Tsukuba University, 12102 A No. 6658, 2013, w/English Translation, Cited in Specification, (5 pages).

Office Action dated Jan. 28, 2020, issued in counterpart JP Application No. 2017-080250, with English translation (10 pages).

METHOD FOR PREPARING SIC SINGLE CRYSTAL

CROSS-REFERENCE TO RELATED APPLICATION

This non-provisional application claims priority under 35 U.S.C. § 119(a) on Patent Application No. 2017-080250 filed in Japan on Apr. 14, 2017, the entire contents of which are hereby incorporated by reference.

TECHNICAL FIELD

This invention relates to a method for preparing a silicon carbide (SiC) single crystal suited for power semiconductor devices by the solution process.

BACKGROUND ART

Silicon carbide (SiC) has overwhelmingly superior basic physical properties for use as power semiconductor devices, including a wide band-gap, high dielectric breakdown, thermal conductivity, chemical stability, and high saturation drift velocity. At the present, silicon-base materials are widely used in power devices. SiC is expected to play the main role for next generation power devices, with some SiC power semiconductor devices being marketed.

At the present, commercially available SiC single crystal wafers are all produced by the sublimation process. When power devices are manufactured using SiC single crystal wafers obtained by the sublimation method, their performance is not necessarily sufficient. This is because it is not easy to form a SiC single crystal with fewer defects. Since the crystal growth by the sublimation process is a precipitation phenomenon from a gas phase, the growth rate is low and the temperature management in a reaction space is difficult. As a result of the recent intensive efforts for improvement by research and development institutes, the density of micropipes is reduced. However, lattice defects, which have an impact upon electric characteristics of devices, such as threading screw dislocations, threading edge dislocations, and basal plane dislocations, are still included at high densities. Of the current commercial SiC single crystal wafers produced by the sublimation process, wafers of small area of not greater than 3 mm by 3 mm for SiC power devices are mass produced, though in low yields, because the influence of dislocations rarely develops, but wafers of larger area for high-current devices are not still mass produced because of outstanding leak current.

Under the circumstances, the method for producing SiC single crystal by the solution process of crystal growth of SiC becomes attractive. See Patent Documents 1 to 3. The solution process for producing SiC single crystal includes a variety of techniques, which are generally divided into four classes: traveling solvent method (TSM), slow cooling technique (SCT), vapor liquid solid (VLS), and top seeded solution growth (TSSG). See Non-Patent Document 1. In general, the solution process implies the TSSG.

CITATION LIST

Patent Document 1: JP-A 2000-264790
Patent Document 2: JP-A 2004-002173
Patent Document 3: JP-A 2006-143555
Patent Document 4: JP-A 2015-054814
Patent Document 5: JP-A 2015-110495
Patent Document 6: JP-A 2015-110496
Patent Document 7: JP-A 2015-110498
Patent Document 8: JP-A 2015-110499
Patent Document 9: JP-A 2015-110500
Patent Document 10: JP-A 2015-110501
Patent Document 11: JP-A 2017-031034
Patent Document 12: JP-A 2017-031036
Non-Patent Document 1: "Newest Technology of SiC Power Device," Chap. 4, Section 1, 1.2 SiC Solution Growth, pages 41-43, S&T Publishing Co., Ltd., 14 May 2010
Non-Patent Document 2: Onda, "Study on fine structure of 4H-SiC crystal defects and influence on device properties", Doctoral Thesis of Tsukuba University, 12102 A No. 6658, 2013

DISCLOSURE OF INVENTION

An object of the invention is to provide a method for preparing a SiC single crystal with low dislocation and defect densities, which is reduced in threading screw dislocations, threading edge dislocations, basal plane dislocations, micropipes, and stacking faults.

Silicon carbide (SiC) itself does not melt under atmospheric pressure. Thus the method for preparing a SiC single crystal by the solution process (which implies seeded solution growth process unless otherwise stated, hereinafter) involves furnishing a Si melt in a graphite crucible, letting C dissolve in the Si melt from a high-temperature region at the crucible bottom, placing a SiC seed crystal in contact with the Si—C solution, and promoting epitaxial growth on the SiC seed crystal. From the solution process wherein crystal growth of SiC proceeds in a state of near thermal equilibrium, a SiC single crystal with significantly reduced dislocations and low defects is obtained as compared with the SiC single crystal obtained from the sublimation process.

With respect to the sublimation process, it is reported in Non-Patent Document 2 that a SiC single crystal with low dislocations can be prepared by the repeated a-face (RAF) method involving alternately repeating crystal growth from (1-100) plane and (11-20) plane of SiC single crystal, and conducting crystal growth on (0001) or (000-1) plane. With respect to the solution process, it is disclosed in Patent Document 4 that when crystal growth on (1-100) plane or (11-20) plane is followed by crystal growth on (0001) plane or (000-1) plane, there is obtained a SiC single crystal with low dislocation and defect densities, which is reduced in threading screw dislocations, threading edge dislocations, basal plane dislocations, and stacking faults. It is then believed that the evolution of threading screw dislocations and threading edge dislocations is restrained during growth on (1-100) plane or (11-20) plane whereas the evolution of basal plane dislocations and stacking faults is restrained during growth on (0001) plane or (000-1) plane. However, as long as the inventors investigated, it was found that when crystal growth on (1-100) or (11-20) plane was followed by crystal growth on (0001) or (000-1) plane, the resulting SiC single crystal was not fully reduced in dislocations and defects.

The inventors have found that when a SiC single crystal is prepared by the solution process, rather than the sequence of crystal growth on (1-100) plane or m-face or (11-20) plane or a-face of a SiC single crystal and subsequent crystal growth on (0001) plane or c-face on Si side or (000-1) plane on C side, the sequence of crystal growth using (0001) or (000-1) plane of SiC single crystal of which the seed crystal is composed as the growth surface and subsequent crystal growth using (1-100) or (11-20) plane of a SiC single crystal resulting from the crystal growth on (0001) or (000-1) plane as the growth surface is effective for producing a SiC single crystal which is more reduced in dislocations and defects and is of high homogeneity and high quality.

Accordingly, the invention provides a method for preparing a SiC single crystal by the solution process of placing a seed crystal in contact with a Si—C solution in a crucible and letting a SiC single crystal to grow from the seed crystal, the method comprising the first growth step of conducting crystal growth using (0001) or (000-1) plane of a SiC single crystal of which the seed crystal is composed, as the growth surface, and the second growth step of conducting crystal growth using (1-100) or (11-20) plane of a SiC single crystal resulting from the first growth step as the growth surface.

The method may further comprise the step of cutting (1-100) or (11-20) plane out of the SiC single crystal resulting from the first growth step, prior to the second growth step.

Preferably, in the second growth step, (1-100) or (11-20) plane of a portion of the SiC single crystal resulting from the first growth step that has grown in the first growth step is made the growth surface.

The method may further comprise the step of cutting (0001) or (000-1) plane out of the SiC single crystal of which the seed crystal is composed, prior to the first growth step.

In a preferred embodiment, the Si—C solution contains at least one metal element M selected from the group consisting of La, Ce, Pr, Nd, Sm, Eu, Gd, Tb, Ho, Lu, Ti, V, Cr, Mn, Fe, Co, Ni, Cu, Al, Ga, Ge, Sn, Pb, and Zn. More preferably, the Si—C solution contains the metal element M in a content of 1 to 80 at % based on the total of Si and M.

Typically, the crucible is a graphite or SiC crucible. A SiC crucible having an oxygen content of up to 100 ppm is preferable.

ADVANTAGEOUS EFFECTS OF INVENTION

According to the invention, a SiC single crystal which has low dislocation and defect densities, i.e., is reduced in threading screw dislocations, threading edge dislocations, basal plane dislocations, micropipes, and stacking faults is prepared by the solution process. The SiC single crystal is of high homogeneity and high quality.

DESCRIPTION OF PREFERRED EMBODIMENTS

As used herein, the abbreviation "TSD" stands for threading screw dislocation, "TED" for threading edge dislocation, "BPD" for basal plane dislocation, and "MP" for micropipe.

The invention pertains to a method for preparing a SiC single crystal by the solution process (i.e., seeded solution growth process) of placing a seed crystal in contact with a Si—C solution or melt in a crucible and letting a SiC single crystal grow from the seed crystal. The crucible may be a graphite crucible (carbon crucible) or SiC crucible (silicon carbide crucible). For the crystal growth of SiC, any of techniques known in the field of the solution process is applicable.

Figure 1:
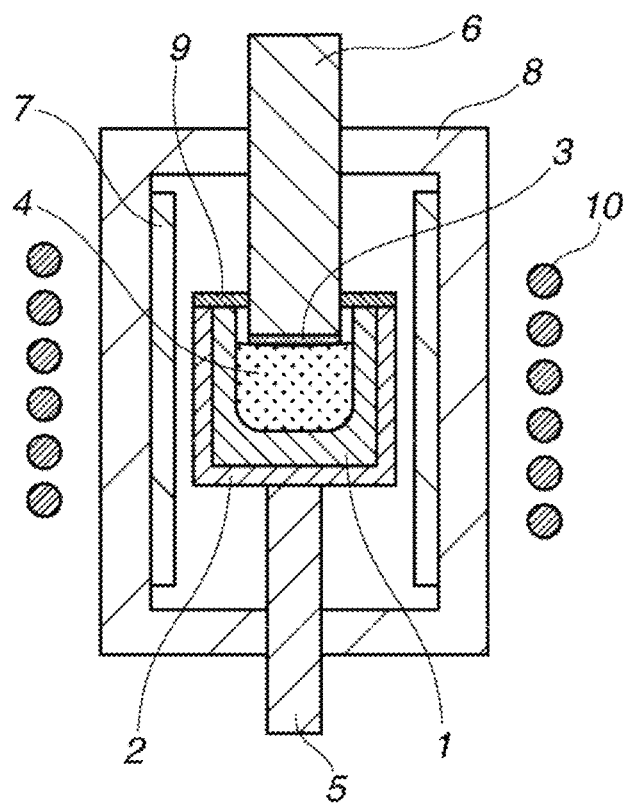
FIG. 1 is a schematic cross-sectional view of an apparatus for the crystal growth of SiC single crystal.

FIG. 1 is a cross-sectional view of a SiC single crystal producing apparatus in the form of a heating furnace which is advantageously used in the growth of SiC single crystal. The furnace includes a crucible 1 for accommodating a Si—C solution, a shell 2 of refractory carbon material enclosing the crucible 1, a seed crystal 3 in the form of SiC single crystal, a Si—C solution 4 in the crucible 1, a lower rotating shaft 5 for supporting and rotating the crucible 1 and shell 2 during crystal growth of SiC single crystal, an upper rotating shaft 6 for holding and rotating the seed crystal 3 during crystal growth of SiC single crystal, a susceptor 7 of graphite or analogous material, an insulating housing 8 of graphite or analogous material, a lid 9 for preventing the Si—C solution from volatilizing off, and a RF coil 10 for heating the furnace interior to set the Si—C solution at the predetermined temperature and temperature distribution. The furnace further includes a discharge port and valve for evacuating the furnace interior atmosphere to vacuum and a feed port and valve for feeding gas into the furnace interior, though they are not shown in the figure.

Prior to heating, the crucible is charged with Si and may be further charged with a C source. As the interior of the crucible is heated, Si is melted, C is dissolved therein, and C on use of a graphite crucible, or Si and C on use of a SiC crucible are leached into the Si melt or Si—C solution from the surface of the crucible in contact with the Si melt immediately after heating or the Si—C solution after dissolution of C.

Preferably the Si—C solution further contains at least one metal element M selected from the group consisting of La, Ce, Pr, Nd, Sm, Eu, Gd, Tb, Ho, Lu, Ti, V, Cr, Mn, Fe, Co, Ni, Cu, Al, Ga, Ge, Sn, Pb, and Zn. The metal element M is effective for enhancing the solubility of C in the Si—C solution. The metal element to be added is not limited to one, namely a plurality of metal elements may be added. The content of metal element M in the Si—C solution is preferably at least 1 at %, more preferably at least 20 at %, and up to 80 at %, more preferably up to 50 at % based on the total of Si and M. When metal element M is contained in the Si—C solution, the crucible prior to heating may be charged with the metal element M as well as Si and optional C.

When a plurality of metal elements are added, it is desirable to use a combination of (A) at least one element selected from the rare earth metals, specifically at least one metal element selected from the group consisting of La, Ce, Pr, Nd, Sm, Eu, Gd, Tb, Ho, and Lu, with (B) at least one element selected from metals other than the rare earth metals, specifically at least one metal element selected from the group consisting of Ti, V, Cr, Mn, Fe, Co, Ni, Cu, Al, Ga, Ge, Sn, Pb, and Zn, preferably at least one element selected from the transition metals, more preferably Ti, V, Cr, Mn, Fe, Co, Ni, Cu, and Zn.

During crystal growth, the temperature of the Si—C solution is preferably controlled in a range of at least 1,300° C., especially at least 1,500° C. and up to 2,300° C., especially up to 2,000° C. In an upper region of the crucible interior, a seed crystal is placed in contact with the Si—C solution, allowing a SiC single crystal to grow on the seed crystal. Accordingly, a portion of the Si—C solution in contact with the crucible assumes, at least in part, a high-temperature zone that allows components of the crucible to be leached into the Si—C solution, whereas a portion of the Si—C solution in contact with the seed crystal or growth surface of SiC single crystal grown on the seed crystal assumes a low-temperature zone that allows SiC to grow as single crystal on the seed crystal or SiC single crystal grown on the seed crystal. The temperature distribution of the Si—C solution is preferably such that the temperature gradually elevates from the vicinity of seed crystal toward the vicinity of the interior surface (in contact with the Si—C solution) of the crucible, preferably the temperature gradually elevates throughout the Si—C solution from the vicinity of seed crystal toward the vicinity of the interior surface (in contact with the Si—C solution) of the crucible; and the temperature gradually elevates from the top to the bottom of the Si—C solution, preferably the temperature gradually elevates throughout the Si—C solution from the top to the bottom of the Si—C solution. Better results are obtained when the temperature difference between the high-temperature zone and the low-temperature zone is, for example, at least 5° C., especially at least 10° C. and up to 200° C., especially up to 100° C. Also preferably the gradient of temperature distribution of the Si—C solution is at least 1° C./cm, especially at least 5° C./cm, and up to 50° C./cm, especially up to 30° C./cm.

In the growth step of SiC single crystal, the desired temperature distribution may be established in the Si—C solution by adequately controlling induction heating conditions from the RF coil, adequately setting the positional relationship, especially vertical positional relationship, of the crucible to the RF coil, and adequately rotating the crucible and the seed (SiC single crystal). This, in turn, enables to adequately control the growth rate of SiC single crystal and the leach-out rate of crucible components into the Si—C solution.

In the solution process, a SiC single crystal is furnished as the seed crystal. The seed may be any of SiC single crystals obtained from the sublimation process and SiC single crystals obtained from the solution process (implying the solution process in a broad sense including TSM, SCT, VLS, and TSSG).

The method of the invention involves the first growth step of growing a SiC single crystal from the seed crystal. In the first growth step, crystal growth is conducted while (0001) plane (or silicon (Si) face, also called c-face) or (000-1) plane (or carbon (C) face) of a SiC single crystal of which the seed crystal is composed is used as the growth surface.

In the first growth step, when the SiC single crystal of which the seed crystal is composed has already exposed (0001) plane or (000-1) plane (specifically (0001) plane or (000-1) plane exists substantially planar on the surface of the seed crystal), that plane as such may be used as the growth surface. When (0001) plane or (000-1) plane is not exposed on the surface of the seed crystal, (0001) plane or (000-1) plane may be cut out by any well-known technique such as cutting or sawing and exposed on the surface of the seed crystal. Even when (0001) plane or (000-1) plane is exposed on the surface of the seed crystal, it is preferred that (0001) plane or (000-1) plane be newly cut out and exposed as a new surface.

The crystal growth from (0001) or (000-1) plane of a SiC single crystal of which the seed crystal is composed, as the growth surface is conducted by placing (0001) or (000-1) plane of a SiC single crystal of which the seed crystal is composed in contact with the Si—C solution in the crucible. Specifically, (0001) or (000-1) plane of a SiC single crystal of which the seed crystal is composed is placed in a direction (typically horizontal direction) perpendicular to the crystal growing direction and brought in contact with the Si—C solution. As the SiC single crystal of which the seed crystal is composed is pulled upward from the Si—C solution in proportion to the progress of crystal growth in the crystal growing direction (typically vertical direction), SiC single crystal is grown or built up. The atmosphere during crystal growth is preferably an inert gas atmosphere, typically a rare gas atmosphere such as helium or argon gas. For example, the crystal pull-up rate (or growth rate of SiC single crystal) is preferably at least 10 μm/hr, especially at least 100 μm/hr and up to 2,000 μm/hr, especially up to 1,000 μm/hr.

The SiC single crystal resulting from the first growth step, i.e., crystal growth from (0001) or (000-1) plane of SiC single crystal, of which the seed crystal is composed, as the growth surface is used in the second growth step as the seed crystal. In the second growth step, crystal growth is conducted using (1-100) plane (i.e., m-face) or (11-20) plane (i.e., a-face) of the SiC single crystal resulting from the first growth step, as the growth surface. The (1-100) or (11-20) plane serving as the growth surface is not (1-100) or (11-20) plane of the seed crystal in the first growth step, but preferably (1-100) or (11-20) plane of a portion of SiC single crystal which has grown in the first growth step, and more preferably excluding (1-100) or (11-20) plane of the seed crystal in the first growth step.

In the second growth step, when the SiC single crystal resulting from the first growth step (serving as the seed crystal in the second growth step) has already exposed (1-100) plane or (11-20) plane (specifically (1-100) plane or (11-20) plane exists substantially planar on the surface of the seed crystal), that plane as such may be used as the growth surface. When (1-100) plane or (11-20) plane is not exposed on the surface of the seed crystal, (1-100) plane or (11-20) plane may be cut out by any well-known technique such as cutting or sawing and exposed on the surface of the seed crystal. Even when (1-100) plane or (11-20) plane is exposed on the surface of the seed crystal, it is preferred that (1-100) plane or (11-20) plane be newly cut out and exposed as a new surface.

The crystal growth from (1-100) or (11-20) plane of the SiC single crystal resulting from the first growth step as the growth surface is conducted by placing (1-100) or (11-20) plane of the SiC single crystal resulting from the first growth step (i.e., the seed crystal in the second growth step) in contact with the Si—C solution in the crucible. Specifically, (1-100) or (11-20) plane of the SiC single crystal is placed in a direction (typically horizontal direction) perpendicular to the crystal growing direction and brought in contact with the Si—C solution. As the SiC single crystal resulting from the first growth step is pulled upward from the Si—C solution in proportion to the progress of crystal growth in the crystal growing direction (typically vertical direction), SiC single crystal is grown or built up. The atmosphere during crystal growth and the crystal pull-up rate (or growth rate of SiC single crystal) may be substantially the same as those in the first growth step.

According to the invention, a SiC single crystal is prepared through the first growth step of crystal growth from (0001) plane, i.e., c-face or (000-1) plane, and the second growth step of crystal growth from (1-100) plane, i.e., m-face or (11-20) plane, i.e., a-face. Accordingly, crystal growth from (0001) or (000-1) plane which is effective for suppressing evolution of BPDs and stacking faults is first performed, and crystal growth from (1-100) or (11-20) plane which is effective for suppressing evolution of TSDs and TEDs is then performed. While this procedure takes the reverse sequence to the prior art procedure involving precedent crystal growth from (1-100) or (11-20) plane which is effective for suppressing evolution of TSDs and TEDs and subsequent crystal growth from (0001) or (000-1) plane which is effective for suppressing evolution of BPDs and stacking faults, the inventive method is successful in preparing a SiC single crystal which is reduced in dislocations and defects (differently stated, reduced in the number and/or size of dislocations and defects) as compared with the prior art method. The inventive method offers a high productivity because the alternate repetition of crystal growths from (1-100) plane and (11-20) plane of SiC single crystal as required in the RAF version of sublimation process is not essential.

For example, the SiC single crystal prepared by the RAF version of sublimation process has a total dislocation density of about 3,000/cm$^2$ as reported in Non-Patent Document 2. By contrast, the inventive method is successful in preparing a SiC single crystal in which the densities of TSDs, TEDs, BPDs, MPs and stacking faults are not more than 10/cm$^2$, specifically at least one of these densities is substantially zero (0/cm$^2$), more specifically all these densities are substantially zero (0/cm$^2$).

Dislocations and defects may be evaluated by machining an assay portion from the SiC single crystal boule, mirror-polishing an assay surface of the specimen such as (0001) plane, dipping the specimen, for example, in molten KOH at 400 to 600° C., for etching the surface, water washing, and drying. The surface is observed for etch pits (EP) under a microscope. Evaluation may be made by judging the type of etch pits in terms of shape and quantitating the number and size of etch pits. Using a laser microscope, for example, it is possible to observe the shape of etch pits, to determine the number of etch pits, and to measure the size (e.g., diameter, width, length, and area) and depth of etch pits. From the depth, the angle of recess slant of etch pits may be calculated. From a difference in slant angle, the type of dislocations may be judged.

Although the plane of the objective portion may be a lattice plane such as (0001) plane, it is preferably a slant plane relative to a specific lattice plane of the crystal lattice of SiC single crystal, rather than a plane parallel or perpendicular to a specific lattice plane of the crystal lattice of SiC single crystal. The assumption that the plane of the objective portion is a slant plane avoids the situation wherein dislocations and defects which are formed parallel to a specific lattice plane of the crystal lattice are not properly evaluated. It is preferred that a slant plane at a low angle (e.g., about 5 to 10°) relative to (0001) plane or (000-1) plane be the assay plane, because all of TSDs, TEDs, BPDs, MPs and stacking faults can be evaluated on only one assay plane.

The threading dislocations (TSDs and TEDs) and BPDs included in SiC single crystal can be discriminated by utilizing the phenomenon that as dislocations are eroded by etching, hexagonal pits are generated from threading dislocations and ellipsoidal pits are generated from BPDs. Also, micropipes (MPs) included in SiC single crystal can be discriminated from the findings that they are already observed as pores prior to etching, and after etching, have a size which is at least twice greater than the EP size of TSDs. Further, stacking faults included in SiC single crystal can be discriminated by transmissive observation and also discriminated as being observed as linear grooves after etching. Further, TSD and TED can be discriminated from a difference in the angle of recess slant of etch pits, as calculated from the depth of etch pits observed under laser microscope.

In the practice of the invention, a SiC crucible is preferred as the crucible. On use of a SiC crucible, Si and C originating from SiC of which the crucible is made are leached into the Si—C solution from the surface of the SiC crucible in contact with the Si—C solution, particularly in its high-temperature zone. The leach-out Si and C become new Si and C components to the Si—C solution and sources for growing single crystal. On use of a SiC crucible which allows Si and C to be leached into the Si—C solution, now that SiC of which the crucible is made is leached as Si and C into the Si—C solution, it does not happen that Si and C precipitate as SiC. This essentially eliminates the problem of precipitation of polycrystalline SiC at the surface of the crucible in contact with the Si—C solution. That is, the use of a SiC crucible as the reservoir for the Si—C solution is advantageous in that precipitation of polycrystalline SiC at a portion of the Si—C solution in contact with the crucible is restrained, and ensures long-term stable production of SiC single crystal. Further, growth of SiC single crystal is carried out while the conditions (e.g., the temperature, especially temperature distribution of the Si—C solution) are set such that Si and C may be fed from the SiC crucible in amounts to compensate for losses of Si and C from the Si—C solution as a result of growth of SiC single crystal. This suppresses a compositional variation of the Si—C solution, ensuring stable production of a SiC single crystal of high uniformity.

As opposed to graphite crucibles, the use of SiC crucibles avoids excessive leaching of carbon C into the Si—C solution, which is effective for suppressing the phenomenon that metal element M bonds with carbon C to form a metal carbide. The metal carbide having a high melting point will contact with SiC single crystal grains growing afloat in the Si—C solution and become an impurity to the SiC single crystal. The use of SiC crucibles avoids excessive leaching of carbon C into the Si—C solution and hence, excessive increase of C/Si ratio, offering advantages including restrained formation of metal carbide and stable formation of SiC single crystal.

Often, the SiC crucible contains oxygen as impurity. Oxygen is contained in the SiC crucible in the form of oxide (SiO). SiO has a melting point of about 1,880° C. When the temperature of the Si—C solution is at or above the boiling point, SiO is gasified in the Si—C solution along with leach-out of SiC. When gaseous SiO reaches the interface (solid-liquid interface) between the Si—C solution and growing SiC single crystal, it can be taken into the crystal growing surface to generate voids in the SiC single crystal. Also, oxygen in the SiC crucible is leached into the Si—C solution along with leach-out of SiC. When the temperature of the Si—C solution is below the boiling point of SiO, oxygen reacts with Si in the Si—C solution to form SiO. When this SiO reaches the interface (solid-liquid interface) between the Si—C solution and growing SiC single crystal, it can be taken into the crystal growing surface to generate voids in the SiC single crystal. For this reason, the SiC crucible should preferably have an oxygen content of not more than 100 ppm.

EXAMPLE

Examples of the invention are given below by way of illustration and not by way of limitation.

Example 1

Using a SiC single crystal producing apparatus as shown in FIG. 1, a SiC single crystal boule was prepared. The crucible used was a graphite crucible having an outer diameter of 70 mm, a height of 80 mm, an inner diameter (reservoir diameter) of 50 mm, and a reservoir height of 70 mm. The crucible was charged with raw materials such that the charge consisted of 16 at % of La, 20 at % of Fe, and 64 at % of Si. The amounts of raw materials charged were determined on the basis of density calculation such that the resulting Si—C solution had a depth of about 27 mm.

There was furnished a 4H-SiC single crystal having a diameter of 50 mm and a thickness of 10 mm produced by the sublimation process, of which a square piece of 10 mm×10 mm×1 mm thick having (000-1) plane serving as the growth surface was cut out as a seed in the first growth step and attached to a square graphite seed of 9 mm×9 mm on the seed shaft (upper rotating shaft). The conditions of the first growth step using this seed crystal included an argon gas atmosphere, a temperature of 1,900° C. at the surface portion (top) of the Si—C solution, counter rotation (clockwise and counter-clockwise) of the crucible and seed crystal each at 20 rpm, and a pull-up rate of 0.2 mm/hr. Crystal growth was continued for 10 hours to produce a SiC single crystal boule including a grown portion having a thickness of 2 mm.

Next, from only the portion of the SiC single crystal boule which had grown during the first growth step, a rectangular piece of 10 mm×2 mm×1 mm thick having (1-100) plane serving as the growth surface was cut out as a seed in the second growth step and attached to a rectangular graphite seed of 9 mm×1 mm on the seed shaft (upper rotating shaft). The conditions of the second growth step using this seed were the same as in the first growth step. The second growth step resulted in a SiC single crystal boule including a grown portion having a thickness of 2 mm.

The SiC single crystal thus obtained was evaluated for TSD, TED, BPD, MP and stacking faults by the following test. From the buildup portion of the SiC single crystal boule which had grown during the second growth step, a piece having a plane inclined 7.8° relative to (0001) plane was cut out. The exposed plane was precision polished by the sequence of polishing on a ceramic platen with diamond abrasive grits with an average particle size of 6 μm, polishing on a cloth platen with diamond abrasive grits with an average particle size of 0.5 μm, and CMP, whereby the cut-out plane was converted to a mirror surface, which was used as an assay surface. The assay surface was then immersed in molten KOH at 500° C. for 10 minutes for etching, washed with water and dried. The assay surface was observed for etch pits (EP) under a laser microscope (LEXT OLS4000 by Olympus Corp., the same hereinafter).

Figure 2:
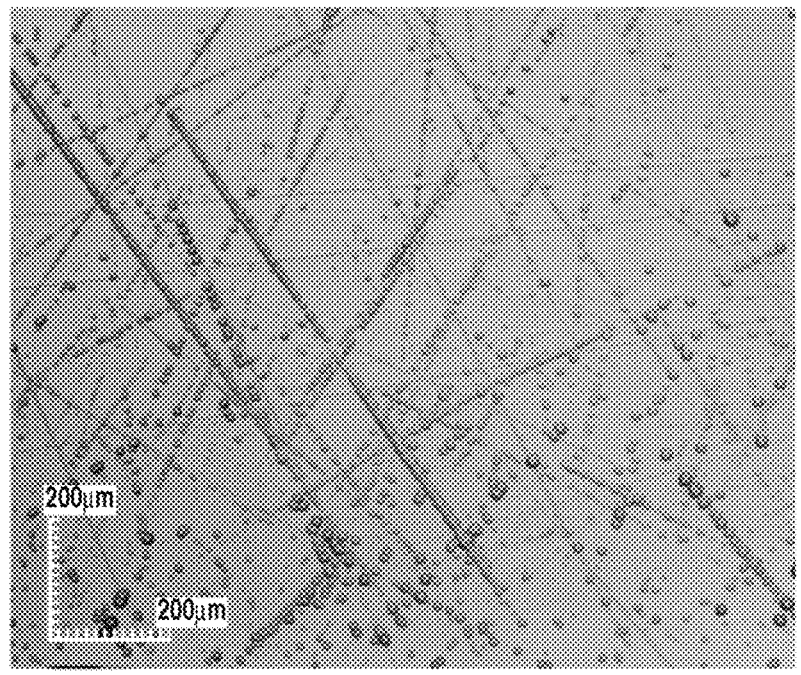
FIG. 2 is a photomicrograph under laser microscope of an assay surface of the SiC single crystal in Example 1.

From the observation under laser microscope, etch pits (EPs) are discriminated on the criterion that EPs of hexagonal shape are threading dislocations (TSDs, TED), EPs of ellipsoidal shape are BPDs, EPs having a size which is at least twice greater than the EP size of threading dislocations are micropipes, and EPs of line shape are stacking faults. Further, TSDs and TEDs are discriminated on the criterion that EPs in which the angle of recess slant of EPs calculated from the depth of EPs as observed under laser microscope (that is, the angle included between an imaginary plane given by extension of the assay surface toward EP top and the recess slant of EPs tangential to the assay surface) is within the range of 28±3° are TSDs, and EPs in which the angle is within the range of 18±3° are TEDs. FIG. 2 is a photomicrograph of the assay surface under the laser microscope.

In the photomicrograph of the SiC single crystal, polishing marks generated upon preparation of the assay surface were observed, whereas none of EPs indicative of TSDs, TEDs, BPDs, MPs, and stacking faults were observed.

Comparative Example 1

Using a SiC single crystal producing apparatus as shown in FIG. 1, a SiC single crystal boule was prepared. In this example, only the first growth step was conducted. The crucible and Si—C solution were the same as in Example 1.

From a 4H—SiC single crystal produced by the sublimation process, a piece with a dimeter of 21 mm and a thickness of 0.3 mm having (000-1) plane serving as the growth surface was cut out as a seed in the first growth step and attached to a graphite seed on the seed shaft (upper rotating shaft). The conditions of the first growth step using this seed crystal were the same as in the first growth step of Example 1. The step resulted in a SiC single crystal boule including a grown portion having a thickness of 2 mm.

The SiC single crystal thus obtained was evaluated for TSD, TED, and BPD by the following test. From the buildup portion of the SiC single crystal boule which had grown during the first growth step, a plurality of pieces having a plane inclined 7.8° relative to (0001) plane were cut out at different positions in the crystal growth direction. The exposed plane was precision polished by the sequence of polishing on a ceramic platen with diamond abrasive grits with an average particle size of 6 μm, polishing on a cloth platen with diamond abrasive grits with an average particle size of 0.5 μm, and CMP, whereby the cut-out plane was converted to a mirror surface, which was used as an assay surface. The assay surface was then immersed in molten KOH at 500° C. for 10 minutes for etching, washed with water and dried. The assay surface was observed for etch pits (EPs) under a laser microscope.

Figure 3:
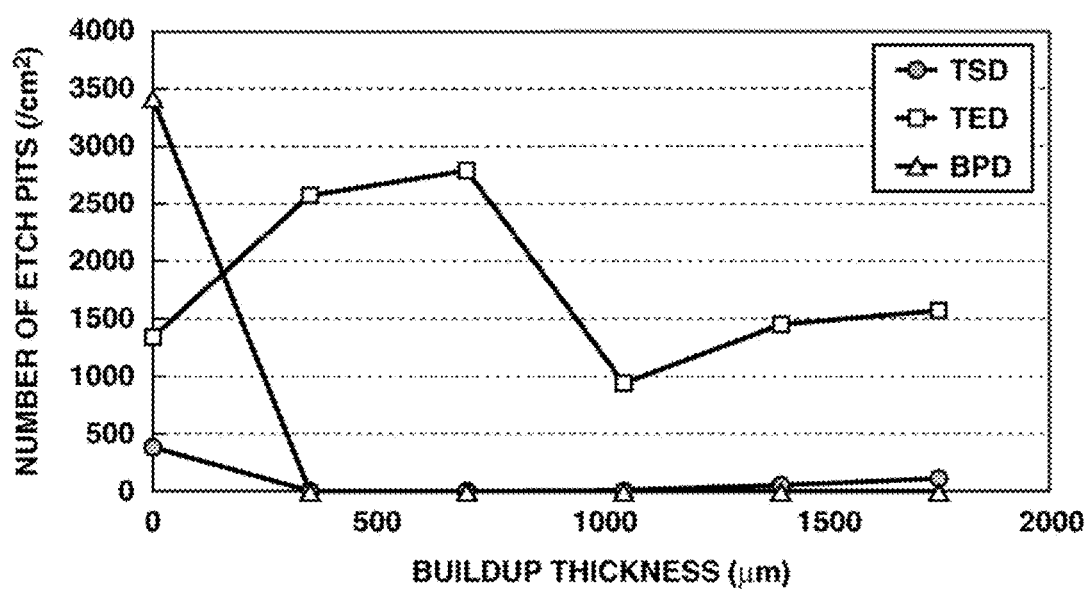
FIG. 3 is a graph plotting the numbers per unit area of TSDs, TEDs, and BPDs along growth direction in the SiC single crystal in Comparative Example 1.

The numbers per unit area of TSDs, TEDs and BPDs were counted on each of the assay surfaces of SiC single crystal at different positions in the crystal growth direction. As shown in FIG. 3, the relationships of a position (buildup thickness) in the crystal growth direction of SiC single crystal to the numbers per unit area of etch pits corresponding to TSDs, TEDs and BPDs, that is, changes of the numbers per unit area of TSDs, TEDs and BPDs along the growth direction of SiC single crystal reveal that although many dislocations are present in the buildup portion immediately below the seed crystal, the total number of dislocations decreases toward the crystal growth direction. Also the changes of the numbers per unit area of TSDs, TEDs and BPDs toward the crystal growth direction reveal that during the first growth step, TSDs and BPDs proceed crystal growth without inheriting the dislocation state of the seed crystal, whereas TEDs do not decrease.

In comparison with the results of Comparative Example 1, the SiC single crystal in Example 1 demonstrates that during the first growth step, crystal growth proceeds without inheriting TSDs and BPDs from the seed crystal, and during the second growth step that follows the first growth step, crystal growth proceeds without converting BPDs to threading dislocations and without inheriting TEDs from the crystal grown in the first growth step. As a result, there is obtained a SiC single crystal having fewer dislocations and fewer defects, especially a SiC single crystal free of dislocations and defects as shown in FIG. 2.

Comparative Example 2

Using a SiC single crystal producing apparatus as shown in FIG. 1, a SiC single crystal boule was prepared. The crucible and Si—C solution were the same as in Example 1.

From a 4H—SiC single crystal with a dimeter of 50 mm and a thickness of 10 mm produced by the sublimation process, a square piece of 10 mm×10 mm×1 mm thick having (1-100) plane serving as the growth surface was cut out as a seed in the first growth step and attached to a square graphite seed of 9 mm×9 mm on the seed shaft (upper rotating shaft). The conditions of the first growth step using this seed crystal were the same as in the first growth step of Example 1. The step resulted in a SiC single crystal boule including a grown portion having a thickness of 2 mm.

Next, from only the portion of the SiC single crystal boule which had grown during the first growth step, a rectangular piece of 10 mm×2 mm×1 mm thick having (000-1) plane serving as the growth surface was cut out as a seed in the second growth step and attached to a rectangular graphite seed of 9 mm×1 mm on the seed shaft (upper rotating shaft). The conditions of the second growth step using this seed were the same as in the first growth step of Example 1. The second growth step resulted in a SiC single crystal boule including a grown portion having a thickness of 2 mm.

Figure 4:
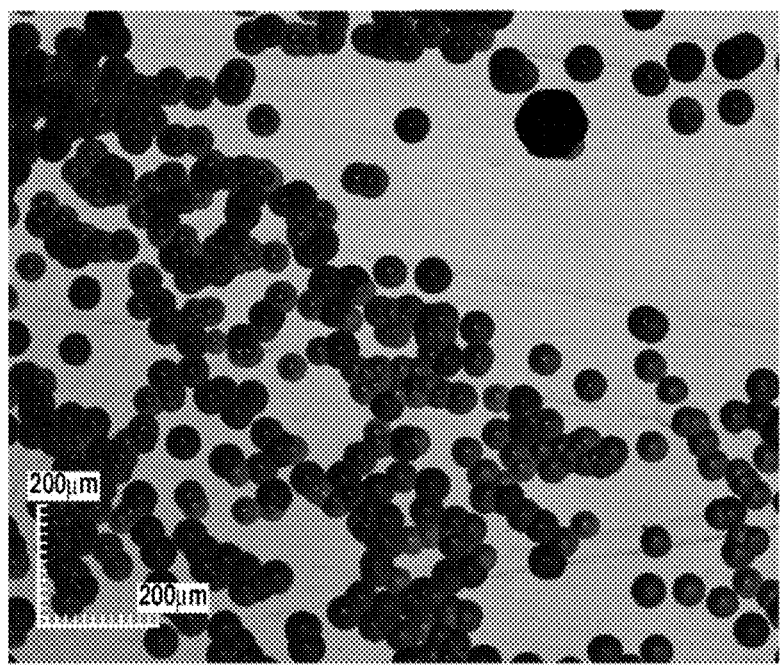
FIG. 4 is a photomicrograph under laser microscope of an assay surface of the SiC single crystal in Comparative Example 2.

The SiC single crystal thus obtained was evaluated for TSD, TED, BPD, MP and stacking faults by the same test as in Example 1. FIG. 4 is a photomicrograph of the assay surface under the laser microscope. In the photomicrograph of the SiC single crystal, etch pits originating from dislocations or defects are definitely observed. The number per unit area was counted to be 23,360/cm$^2$ for TEDs, 433/cm$^2$ for TSDs, 0/cm$^2$ for BPDs, 7/cm$^2$ for MPs, and 0/cm$^2$ for stacking faults.

The reason why numerous TEDs are observed in the SiC single crystal is believed to reside in that since numerous BPDs formed by inheriting the dislocation and defect states of the seed crystal are present in the crystal formed by growth from (1-100) plane (first growth step), some BPDs are converted to TEDs during growth from (000-1) plane (second growth step).

Example 2

Using a SiC single crystal producing apparatus as shown in FIG. 1, a SiC single crystal boule was prepared. The crucible used was a SiC crucible having an oxygen content of not more than 100 ppm, with an outer diameter of 70 mm, a height of 80 mm, an inner diameter (reservoir diameter) of 50 mm, and a reservoir height of 70 mm. The crucible was charged with raw materials such that the charge consisted of 20 at % of La, 20 at % of Fe, and 60 at % of Si. The amounts of raw materials charged were determined on the basis of density calculation such that the resulting Si—C solution had a depth of about 27 mm.

There was furnished a 4H—SiC single crystal having a diameter of 50 mm and a thickness of 10 mm produced by the sublimation process, of which a square piece of 10 mm×10 mm×1 mm thick having (0001) plane serving as the growth surface was cut out as a seed in the first growth step and attached to a square graphite seed of 9 mm×9 mm on the seed shaft (upper rotating shaft). The conditions of the first growth step using this seed crystal included an argon gas atmosphere, a temperature of 1,900° C. at the surface portion (top) of the Si—C solution, counter rotation (clockwise and counter-clockwise) of the crucible and seed crystal each at 20 rpm, and a pull-up rate of 0.2 mm/hr. Crystal growth was continued for 20 hours to produce a SiC single crystal boule including a grown portion having a thickness of 4 mm.

Next, from only the portion of the SiC single crystal boule which had grown during the first growth step, a rectangular piece of 10 mm×4 mm×1 mm thick having (1-100) plane serving as the growth surface was cut out as a seed in the second growth step and attached to a rectangular graphite seed of 9 mm×3 mm on the seed shaft (upper rotating shaft). The conditions of the second growth step using this seed were the same as in the first growth step. The second growth step resulted in a SiC single crystal boule including a grown portion having a thickness of 4 mm.

The SiC single crystal thus obtained was evaluated for TSD, TED, BPD, MP and stacking faults by the same test as in Example 1. In the photomicrograph of the SiC single crystal, none of etch pits indicative of TSDs, TEDs, BPDs, MPs, and stacking faults were observed.

Japanese Patent Application No. 2017-080250 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a SiC single crystal by the solution process of placing a seed crystal in contact with a Si—C solution in a crucible and letting a SiC single crystal to grow from the seed crystal, the method comprising:
   the first growth step of conducting crystal growth using (0001) or (000-1) plane of a SiC single crystal of which the seed crystal is composed, as the growth surface, and
   the second growth step of conducting crystal growth using (1-100) or (11-20) plane of a SiC single crystal resulting from the first growth step as the growth surface.

2. The method of claim 1, further comprising the step of cutting (1-100) or (11-20) plane out of the SiC single crystal resulting from the first growth step, prior to the second growth step.

3. The method of claim 1 wherein, in the second growth step, (1-100) or (11-20) plane of a portion of the SiC single crystal resulting from the first growth step that has grown in the first growth step is made the growth surface.

4. The method of claim 1, further comprising the step of cutting (0001) or (000-1) plane out of the SiC single crystal of which the seed crystal is composed, prior to the first growth step.

5. The method of claim 1 wherein the Si—C solution contains at least one metal element M selected from the group consisting of La, Ce, Pr, Nd, Sm, Eu, Gd, Tb, Ho, Lu, Ti, V, Cr, Mn, Fe, Co, Ni, Cu, Al, Ga, Ge, Sn, Pb, and Zn.

6. The method of claim 5 wherein the Si—C solution contains the metal element M in a content of 1 to 80 at % based on the total of Si and M.

7. The method of claim 1 wherein the crucible is a graphite or SiC crucible.

8. The method of claim 7 wherein the crucible is a SiC crucible having an oxygen content of up to 100 ppm.

9. A method of claim 1 wherein, in the first growth step, the seed crystal is pulled upward from the Si—C solution in the crystal growing direction on the (0001) or (000-1) plane.

10. A method of claim 9 wherein, in the first growth step, said (0001) or (000-1) plane of a SiC single crystal of which the seed crystal is composed is placed in a horizontal direction perpendicular to the crystal growing direction.

11. A method of claim 9 wherein, in each of the first and second growth steps, the seed crystal is pulled upward from the Si—C solution at a rate of 10 to 2,000 μm/hr.

12. The method of claim 1 wherein, in the second growth step, the SiC single crystal resulting from the first growth step is pulled upward from the Si—C solution in the crystal growing direction on the (1-100) or (11-20) plane.

13. A method of claim 12 wherein, in the second growth step, said (1-100) or (11-20) plane of the SiC single crystal resulting from the first growth step is placed in a horizontal direction perpendicular to the crystal growing direction.

* * * * *